United States Patent [19]

Murakami et al.

[11] Patent Number: 5,192,711

[45] Date of Patent: Mar. 9, 1993

[54] METHOD FOR PRODUCING A SEMICONDUCTOR LASER DEVICE

[75] Inventors: Takashi Murakami; Nobuaki Kaneno, both of Itami, Japan

[73] Assignee: Mitsubishi Denki Kabushiki Kaisha, Tokyo, Japan

[21] Appl. No.: 822,662

[22] Filed: Jan. 21, 1992

Related U.S. Application Data

[62] Division of Ser. No. 583,135, Sep. 17, 1990, Pat. No. 5,105,432.

[30] Foreign Application Priority Data

Sep. 18, 1989 [JP] Japan ................................ 1-241418

[51] Int. Cl.$^5$ ........................................... H01L 21/20
[52] U.S. Cl. ................................... 437/129; 437/128; 437/133
[58] Field of Search ............... 437/129, 128, 127, 133; 372/45

[56] References Cited

U.S. PATENT DOCUMENTS

| 4,340,966 | 7/1982 | Akiba et al. | 372/45 |
| 4,949,349 | 8/1990 | Ohba et al. | 372/45 |
| 5,053,356 | 10/1991 | Mitsui et al. | 437/129 |

FOREIGN PATENT DOCUMENTS 63-42114 2/1988 Japan .
63-81884 4/1988 Japan .

OTHER PUBLICATIONS

A. Gomyo et al., "Evidence for the existence of an ordered state in Ga0.5In0.5P grown by metalorganic vapor phase epitaxy and its relation to band-gap energy", Applied Physics Letters 50(11), Mar. 16, 1987, pp. 673-675.

K. Itaya et al., "A New Transverse-Mode Stabilized InGaAlP Visible Light Laser Diode Using p-p Isotype Hetero Barrier Blocking", Extended Abstracts of the 20th Conference on Solid State Devices and Materials, 1988, pp. 307-310.

Primary Examiner—Brian E. Hearn
Assistant Examiner—Linda J. Fleck
Attorney, Agent, or Firm—Leydig, Voit & Mayer

[57] ABSTRACT

A visible light semiconductor laser device has a double heterojunction structure comprising AlGaInP series semiconductors which is produced on a substrate having an electrode on its rear surface. A a p type GaInP buffer layer is provided between a p type GaAs contact layer and a p type AlGaInP cladding layer. The buffer layer has a constant composition ratio and the energy band gap is smaller at the side of the p type GaAs contact layer than at the p type AlGaInP cladding layer. Thus, an energy band discontinuity between the p type GaAs contact layer and the p type AlGaInP cladding layer are relaxed for operation of the laser at low voltage. The laser is produced by varying the growth conditions, such as temperature or V/III ratio during growth, of the buffer layer to vary the energy band gap within the buffer layer.

5 Claims, 2 Drawing Sheets

METHOD FOR PRODUCING A SEMICONDUCTOR LASER DEVICE

This application is a division of application Ser. No. 07/583,135, filed Sep. 17, 1990, now U.S. Pat. No. 5,105,432.

FIELD OF THE INVENTION

The present invention relates to a visible light semiconductor laser device having a double hetero junction structure comprising AlGaInP series semiconductors and a method for producing the same and, more particularly, to reducing lasser operating voltage.

BACKGROUND OF THE INVENTION

FIG. 4 is a cross-sectional view showing a prior art semiconductor laser device. In FIG. 4, Reference numeral designates an n type GaAs substrate. An n type $Al_{0.25}Ga_{0.25}In_{0.5}P$ cladding layer 2 is disposed on the substrate 1. An undoped $Ga_{0.5}In_{0.5}P$ active layer 3 is disposed on the cladding layer 2. A p type $Al_{0.25}Ga_{0.25}In_{0.5}P$ cladding layer 4 is disposed on the active layer 3. An n type GaAs current blocking layer 5 is disposed on the cladding layer 4. A p type $Ga_{0.5}In_{0.5}P$ buffer layer 6 is disposed on the cladding layer 4. A p type GaAs contact layer 8 is disposed on the current blocking layer 5 and the buffer layer 6. An n side electrode 10 is disposed on the rear surface of the substrate 1 and a p side electrode 11 is disposed on the contact layer 8. Reference numeral 9 designates a ridge approximately 3 to 6 microns in width. The distance between the current blocking layer 5 and the active layer 3 is approximately 0.3 microns. Respective layers 2 to 8 are crystal grown by metalorganic chemical vapor deposition (MOCVD).

The device will operate as follows.

When a forward direction voltage is applied between the p side electrode 11 and the n side electrode 10, a current concentratedly flows through the ridge portion 9 because the current blocking layers 5 are provided sandwiching the ridge portion 9. The n type $Al_{0.25}Ga_{0.25}In_{0.5}P$ cladding layer 2, the $Ga_{0.5}In_{0.5}P$ active layer 3, and the p type $Al_{0.25}Ga_{0.25}In_{0.5}P$ cladding layer 4 constitute a double hetero junction structure, and laser light is generated in a region of the active layer 3 directly below the ridge portion 9. The p type $Al_{0.25}Ga_{0.25}In_{0.5}P$ (energy band gap of 2.2 eV)/p type GaAs (energy band gap of 1.42 eV) heterojunction has a large energy band discontinuity therebetween and a large potential barrier exists in the valence band, and therefore it is difficult for a current to flow through the heterojunction. Therefore, a p type $Ga_{0.5}In_{0.5}P$ buffer layer 6 having an energy band gap of about 1.87 eV is inserted between the p type $Al_{0.25}Ga_{0.25}In_{0.5}P$ cladding layer 4 and the p type GaAs contact layer 8 to relax the energy band discontinuity. If the buffer layer 6 is not provided, a predetermined laser light output power cannot be obtained unless the applied voltage is increased. The operating voltage can be reduced to a great extent by inserting the buffer layer 6.

The width of the ridge portion 9 mainly affects the transverse mode control. In this semiconductor laser device, since the distance between the active layer 3 and the current blocking layer 5 is about 0.3 micron and the thickness of the active layer 3 is below 0.1 micron, a portion of the light generated in the active layer 3 reaches up to the current blocking layer 5. However, since the energy band gap of the current blocking layer 5 is smaller than that of the active layer 3, a portion of the light generated in the active layer 3 is absorbed by the current blocking layer 5. On the other hand, no light absorption occurs in the ridge portion 9. Accordingly, a so-called "loss guide" (optical waveguide mechanism utilizing light absorption loss) is produced and a stable fundamental transverse mode is obtained by setting the ridge width at approximately 3 to 6 microns.

The p type $Al_{0.25}Ga_{0.25}In_{0.5}P$ cladding layer 4 has a large resistivity of approximately 0.6 to 0.8 $\Omega m$ irrespective of doping and the ridge width thereof is approximately 3 to 6 microns so as to control the transverse mode. Therefore, this cladding layer 4 is likely to have a high resistance and increases the operating voltage. In order to reduce the operating voltage, it is necessary to relax the band edge discontinuity between p type GaAs and p type AlGaInP.

In the prior art semiconductor laser device constituted as described above, the p type $Ga_{0.5}In_{0.5}P$ buffer layer 6 is inserted between the p type $Al_{0.25}Ga_{0.25}In_{0.5}P$ cladding layer 4 and the p type GaAs contact layer 8 to relax the band discontinuity between the p type AlGaInP and the p type GaAs, and to thereby reduce the operating voltage. However, even the buffer layer 6 is not sufficient.

SUMMARY OF THE INVENTION

The present invention is directed to solving the above-described problems and has for its objects to provide an AlGaInP series visible light semiconductor laser device relaxing the energy band discontinuity between the p type GaAs and the p type AlGaInP and operating at a low voltage.

Other object and advantages of the present invention will become apparent from the detailed description given hereinafter; it should be understood, however, that the detailed description and specific embodiment are given by way of illustration only, since various changes and modifications within the spirit and scope of the invention will be apparent to those skilled in the art from this detailed description.

According to a semiconductor laser device in accordance with the present invention, a p type GaInP buffer layer of a constant composition ratio is produced between a p type GaAs contact layer and a p type AlGaInP cladding layer. The energy band gap of this buffer layer is made smaller at the side of the p type GaAs contact layer than at the side of the p type AlGaInP cladding layer. Therefore an energy band discontinuity between the p type GaAs and the p type AlGaInP can be relaxed sufficiently, whereby the operating voltage can be reduced.

According to a method for producing a semiconductor laser device in accordance with the present invention, while a p type GaInP buffer layer of a constant composition ratio is produced between a p type GaAs contact layer and a p type AlGaInP cladding layer, a portion of the buffer layer adjacent to the p type GaAs contact layer is grown at a temperature lower than the temperature for growing the portion of the buffer layer adjacent to the p type AlGaInP cladding layer. Therefore, a p type GaInP buffer layer whose energy band gap at the side of the p tylxa GaAs contact layer is smaller than that at the side of the p type AlGaInP cladding layer can be easily produced. Furthermore, the p type carrier concentration of the buffer layer at the side of the p type GaAs contact layer is increased, thereby reducing the resistance.

According to a method for producing a semiconductor laser device in accordance with the present invention, while a p type GaInP buffer layer of a constant composition ratio is produced between a p type GaAs contact layer and a p type AlGaInP cladding layer, a portion of the buffer layer adjacent to the p type GaAs contact layer is grown in an atmosphere having a V/III (group five to group three) ratio larger than that ratio for growing another portion of the buffer layer adjacent to the p type AlGaInP cladding layer. Therefore, a p type GaInP buffer layer whose energy band gap is smaller at the side of the p type GaAs contact layer than at the side of the p type AlGaInP cladding layer can be easily produced.

DETAILED DESCRIPTION OF THE PREFERRED EMBODIMENTS

Figure 1:
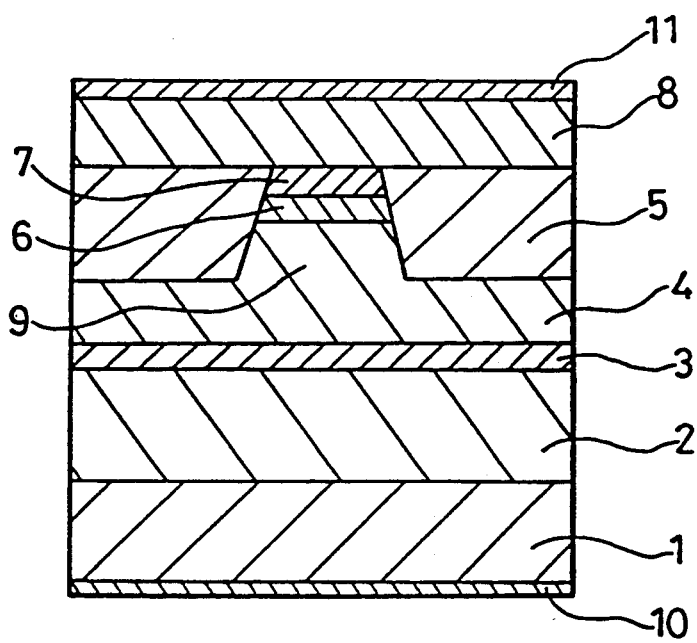
FIG. 1 is a cross-sectional view showing an AlGaInP series visible light semiconductor laser device in accordance with a first embodiment of the present invention.

Embodiments of the present invention will be described in detail with reference to the drawings. FIG. 1 is a cross-sectional view showing an AlGaInP series visible light semiconductor laser device in accordance with an embodiment of the present invention. In FIG. 1, Reference numeral 1 designates an n type GaAs substrate. An n type $Al_{0.25}Ga_{0.25}In_{0.5}P$ cladding layer 2 is disposed on t he substrate 1. An undoped $Ga_{0.5}In_{0.5}P$ active layer 3 is disposed on the cladding layer 2. A p type $Al_{0.25}Ga_{0.25}In_{0.5}P$ cladding layer 4 is disposed on the active layer 3. An n type GaAs current blocking layer 5 is disposed on the cladding layer 4. A p type $Ga_{0.5}In_{0.5}P$ buffer layer 6 is disposed on the cladding layer 4. A p type $Ga_{0.5}In_{0.5}P$ buffer layer 7 which is grown at a relatively low temperature is disposed on the buffer layer 6. A p type GaAs contact layer 8 is disposed on the current blocking layer 5 and the buffer layer 7. An n side electrode 10 is disposed on the rear surface of the substrate 1 and a p side electrode 11 is disposed on the contact layer 8. Reference numeral 9 designates a ridge portion. Here, the respective layers 2 to 6 are grown at 650° C. in an atmosphere having a V/III ratio of 400. The low temperature grown buffer layer 7 is grown while gradually decreasing the temperature from 650° C. to 600° C. The buffer layer 6 is about 0.05 micron thick and the low temperature grown buffer layer 7 is about 0.05 micron thick. MOCVD is employed as the crystal growth method.

Unlike AlGaAs series or InGaAsP series materials $Ga_xIn_{1-x}P$ has specific characteristics. That is, $Ga_xIn_{1-x}P$ which lattice matches with GaAs when x=0.5, but its energy band gap is not determined unconditionally when only the composition ratio is determined.

Figure 2:
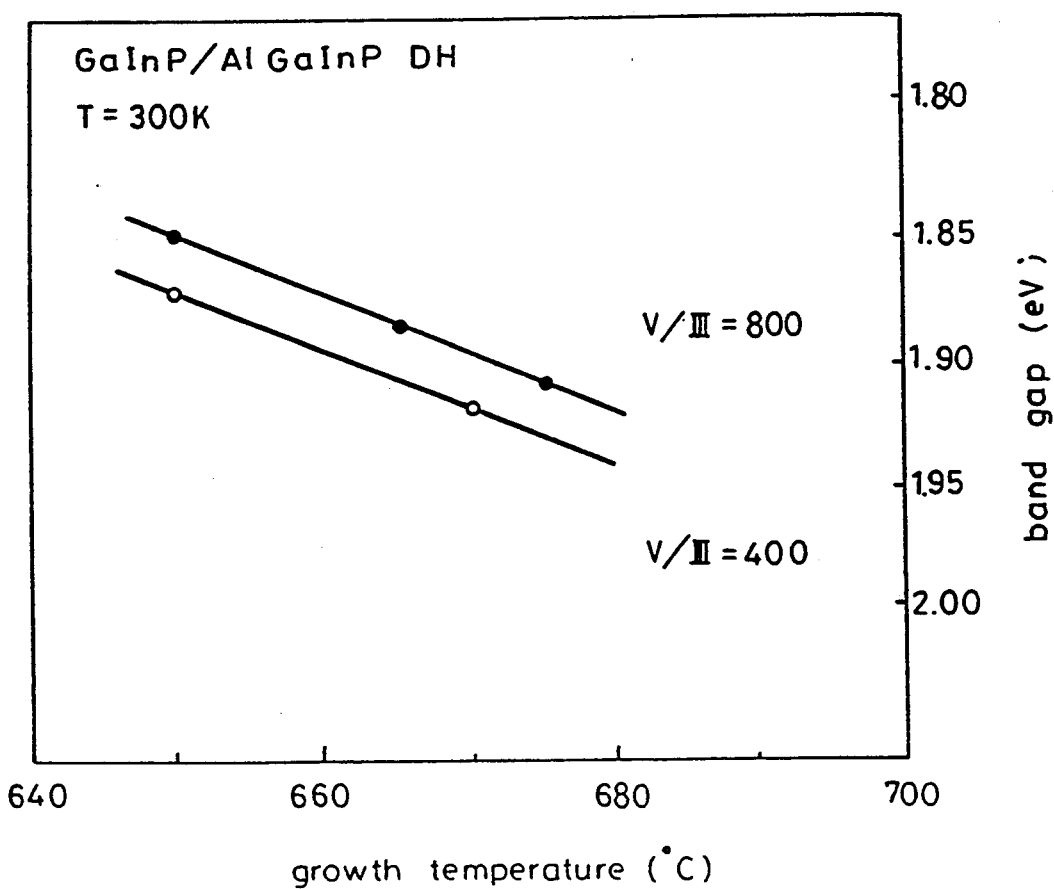
FIG. 2 is a diagram showing the relation between the energy band gap of $Ga_{0.5}In_{0.5}P$ and crystal growth conditions.

FIG. 2 shows the relation between the energy band gap of $Ga_{0.5}In_{0.5}P$ which lattice matches with GaAs and the growth temperature and a relation between the energy band gap and the V/III ratio (mol ratio of V group element and III group element in a vapor phase) in a case where the crystal growth is performed by MOCVD.

When the growth temperature is high, the energy band gap is large, and when the growth temperature is low, the energy band gap is small. In this embodiment, utilizing this characteristic, the energy band gap of GaInP at the side of AlGaInP is made large and that at the side of GaAs is made small. Therefore, the energy band gap continuously varies and the energy band discontinuity is sufficiently relaxed, resulting in a visible light semiconductor laser having low operating voltage.

The device will operate as follows.

In the semiconductor laser device constituted as described above, the energy band gaps of the p type $Al_{0.25}Ga_{0.25}In_{0.5}P$ cladding layer 4, the p type $Ga_{0.5}In_{0.5}P$ buffer layer 6, the low temperature grown p type $Ga_{0.5}In_{0.5}P$ buffer layer 7, and the p type GaAs contact layer 8 gradually change as 2.2 eV, 1.87 eV, 1.82 eV, 1.42 eV, and the potential barrier at the side of the valence band is relaxed, resulting in a low operating voltage. Generation of laser light, transverse mode control and the like are the same as the conventional device. In addition, by decreasing the growth temperature of the buffer layer, the p type dopant (for example, zinc) is easily surrounded by the growth layers. Then, the carrier concentration increases, and the resistance thereof is reduced and the potential barrier is relaxed.

Figure 3:
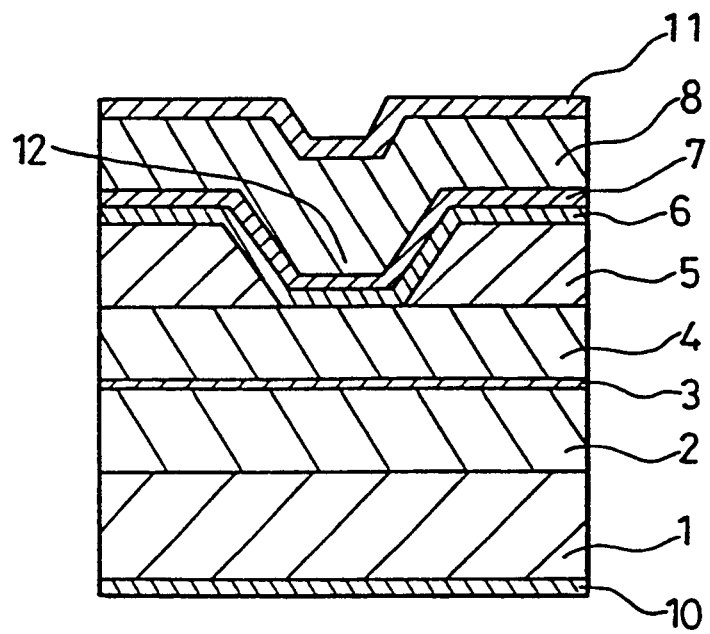
FIG. 3 is a cross-sectional view showing an AlGaInP series visible light semiconductor laser device in accordance with a second embodiment of the present invention.
Figure 4:
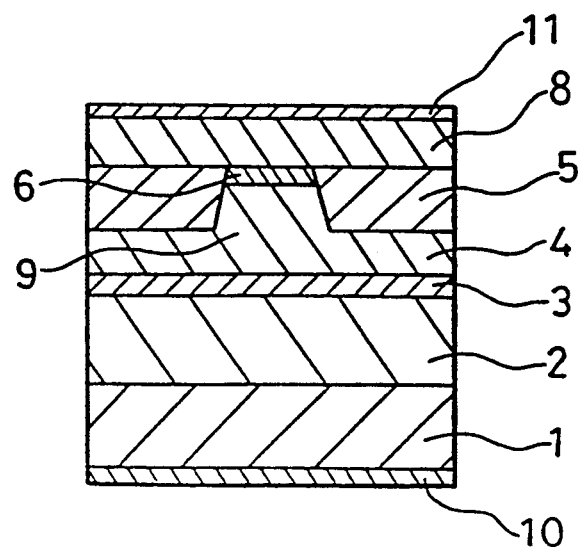
FIG. 4 is a cross-sectional view showing an AlGaInP series visible light semiconductor laser device in accordance with the prior art.

FIG. 3 shows a semiconductor laser device in accordance with another embodiment of the present invention. In figure the same reference numeral designate the same or corresponding portions as those shown in FIG. 1. Reference numeral 12 designates a stripe-shaped groove produced in the current blocking layers 5, through which current flows confined by the current blocking layers 5. While in the laser device of FIG. 1 the p type $Ga_{0.5}In_{0.5}P$ buffer layer 6 and the low temperature grown p type $Ga_{0.5}In_{0.5}P$ buffer layer 7 are disposed on the ridge portion 9, in this embodiment they are disposed in the groove 12. Also in the structure of FIG. 3, in order to relax the energy band discontinuity between the p type $Al_{0.25}Ga_{0.25}In_{0.5}P$ cladding layer 4 and the p type GaAs contact layer 8, the p type $Ga_{0.5}In_{0.5}P$ buffer layer 6 and the low temperature grown p type $Ga_{0.5}In_{0.5}P$ buffer layer 7 function effectively.

In addition, although the energy band gap of the buffer layer is varied by changing the growth temperature in the above embodiments, the energy band gap can be varied by changing the V/III ratio as shown in FIG. 2. Therefore, while growing the p type $Ga_{0.5}In_{0.5}P$ buffer layer, the V/III ratio of the buffer layer at the side of AlGaInP is lowered and that at the side of GaAs is increased. In this case, also the same effect as in the above-described embodiments can be obtained.

As is evident from the foregoing description, according to a semiconductor laser device of the present invention, a p type GaInP buffer layer of a constant composition ratio is produced between a p type GaAs contact layer and a p type AlGaInP cladding layer. The energy band gap of the type GaInP buffer layer is made smaller at the p type GaAs contact layer than at the p type AlGaInP cladding layer. Therefore, an energy band discontinuity between the p type GaAs and the p type AlGaInP can be relaxed sufficiently, and a visible light semiconductor laser device having a low operating voltage can be obtained.

According to a method for producing a semiconductor laser device, when a p type GaInP buffer layer of a constant composition ratio is produced between a p type GaAs contact layer and a p type AlGaInP cladding layer, a portion of the buffer layer adjacent to the p type GaAs contact layer is grown at a temperature lower than a temperature for growing portion of the buffer layer adjacent to the p type AlGaInP cladding layer. Or, a portion of the buffer layer adjacent to the p type GaAs contact layer is grown in an atmosphere having a V/III ratio larger than that ratio for growing the portion of the buffer layer adjacent to the p type AlGaInP cladding layer. Therefore, the p type GaInP buffer layer whose energy band gap is made smaller at the side of the p type GaAs contact layer than at the p type AlGaInP cladding layer can be easily produced. Furthermore, in the method of varying the growth temperature, p type carrier concentration of the buffer layer at the side of the p type GaAs contact layer can be increased, resulting in a low resistivity.

What is claimed is:

1. A method for producing a semiconductor laser device having a double heterojunction structure comprising AlGaInP series semiconductor layers including a p type GaAs contact layer, a p type AlGaInP cladding layer, and a p type GaInP buffer layer disposed between and contacting said contact and cladding layers comprising:

growing a portion of said p type GaInP buffer layer on said p type AlGaInP cladding layer at a first temperature to produce GaInP having a first energy band gap and growing a portion of said buffer layer adjacent to said p type GaAs contact layer at a second temperature lower than the first temperature to produce GaInP having a second energy band gap smaller than the first energy band gap.

2. A method for producing a semiconductor laser device having a double heterojunction structure comprising AlGaInP series semiconductor layers including a p type GaAs contact layer, a p type AlGaInP cladding layer, and a p type GaInP buffer layer disposed between and contacting said contact and cladding layers comprising:

growing a portion of said p type GaInP buffer layer on said p type AlGaInP cladding layer in an MOCVD process having a first mol ratio of the Group V element to the Group III elements to produce GaInP having a first energy band gap and growing a portion of said buffer layer adjacent to said p type contact layer in an MOCVD process having a second mol ratio of the Group V element to the Group III elements higher than the first mol ratio to produce GaInP having a second energy band gap smaller than the first energy band gap.

3. A method for producing a semiconductor laser device comprising:

growing a first cladding layer on a substrate;
growing an active layer on the first cladding layer;
growing a second cladding layer on the active layer;
growing a GaInP buffer layer on the second cladding layer including changing the growth conditions to produce a buffer layer having a first energy band gap initially and a second energy band gap, smaller than the first energy band gap, subsequently without changing the ratio of gallium to indium within the buffer layer;
growing a contact layer on the buffer layer; and
depositing electrodes on the substrate and contact layer.

4. The method of claim 3 including decreasing the temperature during growth of the GaInP buffer layer to decrease the energy band gap of the GaInP buffer layer.

5. The method of claim 3 including growing the GaInP buffer layer by MOCVD and increasing the mol ratio of phosphorus to gallium and indium during growth of the GaInP buffer layer to decrease the energy band gap of the GaInP buffer layer.

* * * * *